(12) United States Patent
Boothby

(10) Patent No.: US 12,033,996 B2
(45) Date of Patent: Jul. 9, 2024

(54) SYSTEMS AND METHODS FOR ASSEMBLING PROCESSOR SYSTEMS

(71) Applicant: D-Wave Systems Inc., Burnaby (CA)

(72) Inventor: Kelly T. R. Boothby, Vancouver (CA)

(73) Assignee: 1372934 B.C. LTD., Burnaby (CA)

( * ) Notice: Subject to any disclaimer, the term of this patent is extended or adjusted under 35 U.S.C. 154(b) by 413 days.

(21) Appl. No.: 17/026,740

(22) Filed: Sep. 21, 2020

(65) Prior Publication Data

US 2021/0091062 A1    Mar. 25, 2021

Related U.S. Application Data

(60) Provisional application No. 62/904,462, filed on Sep. 23, 2019.

(51) Int. Cl.
  *H01L 25/18*   (2023.01)
  *H01L 23/00*   (2006.01)
  (Continued)

(52) U.S. Cl.
  CPC .............. *H01L 25/18* (2013.01); *H01L 24/16* (2013.01); *H01L 24/17* (2013.01); *H01L 24/81* (2013.01); *H01L 25/50* (2013.01); *H05K 1/181* (2013.01); *H05K 1/182* (2013.01); *H01L 2224/16145* (2013.01); *H01L 2224/16238* (2013.01); *H01L 2224/17155* (2013.01); *H01L 2224/17505* (2013.01); *H01L 2224/81815* (2013.01);
  (Continued)

(58) Field of Classification Search
  None
  See application file for complete search history.

(56) References Cited

U.S. PATENT DOCUMENTS

| 3,343,979 A | 9/1967 | Hamrin |
| 3,859,149 A | 1/1975 | Kay |

(Continued)

FOREIGN PATENT DOCUMENTS

| CN | 85101736 A | 1/1987 |
| CN | 1140008 A | 1/1997 |

(Continued)

OTHER PUBLICATIONS

Non Final Office Action for U.S. Appl. No. 16/465,765, mailed Jun. 28, 2022, 7 pages.

(Continued)

*Primary Examiner* — Hung K Vu
(74) *Attorney, Agent, or Firm* — Cozen O'Connor

(57) ABSTRACT

This disclosure generally relates to processor systems comprising printed circuit boards, I/O chips and processor chips with mated contacts. Contacts are formed on an upper surface of a printed circuit board having a through-hole and on a processor chip inside the through-hole. The processor chip may be a superconducting quantum processor chip comprising qubits, couplers, Digital to Analog converters, QFP shift registers and analog lines. Contacts are formed on an upper surface on an I/O chip and mated with the contacts on the printed circuit board and the processor chip. Contacts may be Indium bump bonds or superconducting solder bonds. The processor chip and the I/O chip may include a shield layer, a substrate layer and a thermally conductive layer.

9 Claims, 9 Drawing Sheets

(51) Int. Cl.
*H01L 25/00* (2006.01)
*H05K 1/18* (2006.01)
(52) U.S. Cl.
CPC ............. *H05K 2201/09072* (2013.01); *H05K 2201/1053* (2013.01); *H05K 2201/10537* (2013.01)

(56) References Cited

U.S. PATENT DOCUMENTS

| | | | |
|---|---|---|---|
| 4,141,850 A | 2/1979 | Readio et al. |
| 4,144,119 A | 3/1979 | Dutkewych et al. |
| 4,437,931 A | 3/1984 | Elias et al. |
| 4,466,859 A | 8/1984 | Nelson |
| 4,632,727 A | 12/1986 | Nelson |
| 4,660,061 A | 4/1987 | Sweeny et al. |
| 4,849,124 A | 7/1989 | Backus |
| 4,915,781 A | 4/1990 | Bohnen et al. |
| 4,954,480 A | 9/1990 | Imanaka et al. |
| 4,956,035 A | 9/1990 | Sedlak |
| 5,106,454 A | 4/1992 | Allardyce et al. |
| 5,430,012 A | 7/1995 | Nakamura et al. |
| 5,440,239 A | 8/1995 | Zappella et al. |
| 5,492,595 A | 2/1996 | Carano et al. |
| 5,532,094 A | 7/1996 | Arimura et al. |
| 5,538,152 A | 7/1996 | Fontana |
| 5,800,859 A | 9/1998 | Price et al. |
| 5,933,327 A | 8/1999 | Leighton et al. |
| 6,086,779 A | 7/2000 | Bishop et al. |
| 6,184,477 B1 | 2/2001 | Tanahashi |
| 6,444,140 B2 | 9/2002 | Schemenaur et al. |
| 6,678,540 B2 | 1/2004 | Wire et al. |
| 6,746,621 B2 | 6/2004 | Kurii et al. |
| 6,747,217 B1 | 6/2004 | Jochym et al. |
| 6,852,926 B2 | 2/2005 | Ma et al. |
| 7,135,701 B2 | 11/2006 | Amin et al. |
| 7,148,483 B1 | 12/2006 | Testardi |
| 7,429,502 B2 | 9/2008 | Archer et al. |
| 7,533,068 B2 | 5/2009 | Maassen et al. |
| 7,624,088 B2 | 11/2009 | Johnson et al. |
| 7,687,938 B2 | 3/2010 | Bunyk et al. |
| 7,800,395 B2 | 9/2010 | Johnson et al. |
| 7,898,282 B2 | 3/2011 | Harris et al. |
| 7,932,515 B2 | 4/2011 | Bunyk |
| 8,008,942 B2 | 8/2011 | Van et al. |
| 8,018,244 B2 | 9/2011 | Berkley |
| 8,190,548 B2 | 5/2012 | Choi |
| 8,195,596 B2 | 6/2012 | Rose et al. |
| 8,315,678 B2 | 11/2012 | Uchaykin |
| 8,421,053 B2 | 4/2013 | Bunyk et al. |
| 8,441,329 B2 | 5/2013 | Thom et al. |
| 8,481,472 B2 | 7/2013 | Westwood et al. |
| 8,649,834 B1 | 2/2014 | Jones |
| 8,772,759 B2 | 7/2014 | Bunyk et al. |
| 8,904,632 B2 | 12/2014 | Weatherspoon et al. |
| 9,175,404 B2 | 11/2015 | Kojima et al. |
| 9,865,648 B2 | 1/2018 | Bunyk |
| 10,446,466 B1 | 10/2019 | Milne et al. |
| 2006/0147154 A1 | 7/2006 | Thom et al. |
| 2006/0225165 A1 | 10/2006 | Maassen et al. |
| 2008/0286989 A1 | 11/2008 | Strauss |
| 2009/0008632 A1 | 1/2009 | Bunyk et al. |
| 2009/0039501 A1 | 2/2009 | Von et al. |
| 2009/0099025 A1 | 4/2009 | Uchaykin |
| 2009/0173936 A1 | 7/2009 | Bunyk |
| 2010/0052024 A1 | 3/2010 | Kiyomura et al. |
| 2011/0022820 A1 | 1/2011 | Bunyk et al. |
| 2011/0031634 A1* | 2/2011 | Pagaila ............... H01L 23/34 257/777 |
| 2012/0007230 A1 | 1/2012 | Hwang et al. |
| 2012/0068334 A1 | 3/2012 | Migita et al. |
| 2013/0234909 A1 | 9/2013 | Koh et al. |
| 2015/0119252 A1 | 4/2015 | Ladizinsky et al. |
| 2015/0243609 A1* | 8/2015 | Lamorey ............... H01L 25/165 361/717 |
| 2016/0348245 A1 | 12/2016 | Jin et al. |
| 2020/0084882 A1 | 3/2020 | Neufeld |
| 2020/0119251 A1 | 4/2020 | Yohannes et al. |
| 2020/0404792 A1 | 12/2020 | Burress et al. |
| 2021/0091062 A1 | 3/2021 | Boothby |

FOREIGN PATENT DOCUMENTS

| | | |
|---|---|---|
| CN | 103918357 A | 7/2014 |
| EP | 0150512 A2 | 8/1985 |
| EP | 0164757 A2 | 12/1985 |
| EP | 2225175 A1 | 9/2010 |
| TW | 200952589 A | 12/2009 |
| TW | 201734264 A | 10/2017 |
| WO | 2010039936 A2 | 4/2010 |
| WO | 2017155531 A1 | 9/2017 |
| WO | 2018106942 A1 | 6/2018 |

OTHER PUBLICATIONS

Non-Final Office Action Issued in U.S. Appl. No. 16/896,554, Mailed Aug. 11, 2022, 2021, 8 pages.
PubChem Sodium 4-hydroxybenzenesulfonate (Compound)URL: https://pubchem.ncbi.nlm.nih.gov, Sep. 14, 2005, 22 pages.
Amin, "Effect of Local Minima on Adiabatic Quantum Optimization," Physical Review Letters 100(130503), 2008, 4 pages.
Ardavan et al., "Nanoscale solid-state quantum computing", Philosophical Transactions of the Royal Society of London, Jun. 11, 2003.
Blatter et al., "Design aspects of superconducting-phase quantum bits," Physical Review B 63: 174511-1-174511-9, 2001.
Chinese Office Action dated Jan. 5, 2022 for Chinese Application No. 201780076119.9 in 10 pages (translation of action).
F. Pobell, "Matter and Methods at Low Temperatures", Springer-Verlag, 2nd Edition, 1996.
Farhi et al., "Quantum Adiabatic Evolution Algorithms versus Simulated Annealing," MIT-CTP #3228, arXiv:quant- ph/0201031 v1, pp. 1-16, Jan. 8, 2002.
Feynman, "Simulating Physics with Computers," International Journal of Theoretical Physics 21(6/7): 467-488, 1982.
Friedman et al., "Quantum superposition of distinct macroscopic states," Nature 406:43-46, Jul. 6, 2000.
Il'ichev et al., "Continuous Monitoring of Rabi Oscillations in a Josephson Flux Qubit," Physical Review Letters 91(9): 097906-1-097906-4, week ending Aug. 29, 2003.
International Search Report and Written Opinion dated Apr. 5, 2018, for PCT/US2017/065152 in 10 pages.
Krenner et al., "Recent advances in exciton-based quantum information processing in quantum dot nanostructures", New Journal of Physics, Aug. 26, 2005.
Maasen van den Brink et al., "Mediated Tunable Coupling of Flux Qubits," New Journal of Physics 7(230) 2005, 19 pages.
Makhlin et al., "Quantum-state engineering with Josephson-junction devices," Reviews of Modern Physics 73 (2):357-400, Apr. 2001.
Mooij et al., "Josephson Persistent-Current Qubit," Science 285:1036-1039, Aug. 13, 1999.
Nielsen et al., Quantum Computation and Quantum Information, Cambridge University Press, Cambridge, 2000, "7.8 Other implementation schemes," pp. 343-345.
Orlando et al., "Superconducting persistent-current qubit," Physical Review B 60(22):15398-15413, Dec. 1, 1999.
Shor, "Introduction to Quantum Algorithms," AT&T Labs—Research, arXiv:quant-ph/0005003 v2, pp. 1-17, Jul. 6, 2001.
T. Miyazaki, S. Yorozu, M. Maezawam M. Hidaka, J-S Tsai, "Development of SFQ Multi-Chip Modules for Quantum Bits", IEEE Transactions on Applied Superconductivity, Jun. 2007.
T. Ogashiwa et al., "Flip-Chip Bonding Using Superconducting Solder Bump", Jpn. J. Appl. Phys., Aug. 1995.
T. P. Spiller, I. D'Amico & B. W. Lovett, "Entanglement distribution for a practical quantum-dot-based quantum processor architecture", New Journal of Physics, Jan. 29, 2007.

(56) References Cited

OTHER PUBLICATIONS

Yokoyama et al., "Robust Superconducting Die Attach Process", IEEE Transactions on Applied Superconductivity, Jun. 1997.
Notice of Allowance for U.S. Appl. No. 16/465,765, mailed d Dec. 14, 2022, 9 pages.
"Detailed Procedures of Plating Copper for PCB Processing", PCBWay, Sep. 14, 2018, 6 pages.
"Thetawet TM Fs-8150" Short-Chain Telomer-based Fluorosurfactant, Technical Data Sheet, Innovative Chemical Technologies, Inc., US EPA 2010/2015—2 pages.
Feng, et al., "Cupric Chloride-HCI Acid Microetch Roughening Process", PCB Fabriction, OnBoard Technology Sep. 2008—4 pages.
Tang, et al., "Advance Surfactant-Modified Wet Anisotropic Etching", ResearchGate, Nagoya University Japan, Chapter—Dec. 2011, 25 pages.
Beyne, "A New Approach to Fan-out Wafer-level Packaging", Imec R&D, nano electronics an digital technologies, Jun. 6, 2019. Available: https://www.imec-int.com/en/imec-magazine/imec-magazine-june-2019/a-new-approach-to-fan-out-wafer-level-packaging.
Foxen, et al., "Qubit Compatible Superconducting Interconnects", Quantum Sci Technol. 3(2018)014005, Nov. 30, 2017. [online]. Available: https://iopscience.iop.org/article/10.1088/2058-9565/aa94fc.
LaPedus, "Bridges vs. Interposers," Semiconductor Engineering, Feb. 6, 2019. [Online]. Available: https://semiengineering.com/using-silicon-bridges-in-packages/.
Barends, et al., "Loss and decoherence due to stray infrared light in superconducting quantum circuits", arXiv:1105.4642v1 [cond-mat.mes-hall] May 23, 2011, 4 pages.
Baselmans, et al., "Long quasiparticles lifetime in Aluminum Microwave Kinetic Inductance Detectors using coaxial stray light filters", ResearchGate, Dec. 2009, 5 pages.
Klaassen, et al., "Scattering of sub-millimeter radiation from rough surfaces: absorbers and diffuse reflectors for HIFI and PACS", .IR Space Telescopes and Instruments, vol. 4850 (2003), 9 pages.
Klaassen, et al., "THz calorimetry: an absolute power meter for TeraHertz radiation and the absorptivity of the Herschel Space Observatory telescope mirror coating", Proc. of SPIE vol. 5354, 9 pages, 2010.
Lee, "The Feasibility of Au Bonding on SN-Plated Cu", Journal of Electronic Materials, 2007.
Luo, "Superconductivity In Noble-Metal-Rich Hexagonal Close-Packed Phases", 1970.
Materion, "Electrical Damage Machining (Spark Erosion) of Copper Beryllium", Tech Briefs, AT0007/0311, 2011, Materion Brush Inc. 2 pages.
Tuckerman, "Heat-Transfer Microstructures for Integrated Circuits", Ph. D Thesis, 1984, 160 pages.
Woodcraft, et al., "Thermal design and performance of the SCUBA-2 instrument 1-K and mK systems", Cryogenics 49, 504-513 (2009), 10 pages.

\* cited by examiner

SYSTEMS AND METHODS FOR ASSEMBLING PROCESSOR SYSTEMS

FIELD

This disclosure generally relates to processor systems comprising printed circuit boards, I/O chips and processor chips.

BACKGROUND

Frequency Multiplexed Resonant (FMR) Readout

Superconducting microwave resonators have been used in a variety of fields including, but not limited to, quantum computation and astronomy. For example, in quantum computation, superconducting resonators have been used to detect the state of qubits. In astronomy, superconducting microwave resonators have been used in Microwave Kinetic Inductance Detectors (MKIDs). In both cases, many resonators (used as detectors or in detectors) can be coupled to a common transmission line and integrated through frequency domain multiplexing.

Using frequency multiplex resonant (FMR) technology, superconducting resonators of different resonant frequencies can be used for readout of multiple qubits. The resonators can share a common microwave transmission line by using frequency domain multiplexing.

Printed Circuit Boards

Since they were first introduced around the time of World War II, conventional printed circuit boards ("PCBs") have simultaneously reduced in size and grown in sophistication. An important step in this evolution was the introduction of conductive vias to provide electrical communication between separate layers of a PCB. In non-superconducting applications, multilayer PCBs (i.e., PCBs with two or more layers of conductive traces) have been used for decades. However, a number of challenges that are inherent in non-superconducting electronics (e.g., power consumption and heat dissipation) continue to influence each stage of development of these devices and, ultimately, may limit the capabilities of non-superconducting PCB technology.

Superconducting technology can offer many advantages over conventional, non-superconducting electronics. Superconductors operate in a regime of little to no electrical resistance, and therefore do not generate heat to the same extent as conventional non-superconducting devices. Furthermore, superconducting devices are capable of achieving very high operational speeds. Many of the challenges that continue to plague conventional non-superconducting electronics technology may be overcome or circumvented by a conversion to superconducting technology. Superconducting circuits using single- or double-layer PCBs have been described. Superconducting connections provided to internal layers of a multi-layer circuit board structure, for example by superconducting vias, are described in U.S. Pat. No. 8,315,678 ("Systems, Methods, And Apparatus For Multilayer Superconducting Printed Circuit Boards").

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

In one implementation, the superconducting qubit includes a superconducting loop interrupted by a Josephson junction. The ratio of the inductance of the Josephson junction to the geometric inductance of the superconducting loop can be expressed as $2\pi L I_C/\Phi_0$ (where L is the geometric inductance, $I_C$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

A processor system is described. The processor system comprises a processor chip, the processor chip has a major face, a perimeter which bounds the major face of the processor chip and that has a set of dimensions, and a plurality of contacts, the contacts of the processor chip distributed along the perimeter of the processor chip; a printed circuit board, the printed circuit board has a through-hole and a plurality of contacts, the through-hole having a perimeter with a set of dimensions, the dimensions of the through-hole larger than corresponding dimensions of the processor chip to receive the processor chip at least partially by the through-hole, the contacts of the printed circuit board distributed about the perimeter of the through-hole; and an input/output (I/O) chip, the I/O chip having a major face, a perimeter which bounds the major face of the I/O chip and that has a set of dimensions that are larger than corresponding dimensions of the through-hole of the printed circuit board, a first plurality of contacts, and a second plurality of contacts, the first plurality of contacts of the I/O chip distributed along the perimeter of the I/O chip, the second plurality of contacts distributed along the perimeter of the I/O chip spaced inwardly from the first plurality of contacts with respect to the perimeter of the I/O chip, at least a portion of the major face of the I/O chip covering at least a portion of the major face of the processor chip and at least a portion of the major face of the I/O chip covering at least a portion of the major face of the printed circuit board, the first plurality of contacts of the I/O chip positioned to mate with the plurality of contacts of the printed circuit board, and the second plurality of contacts of the I/O chip positioned to mate with the plurality of contacts of the processor chip. The plurality of contacts of the processor chip, the plurality of contacts of the printed circuit board and the first and the second plurality of contacts of the I/O chip may be at least one of: Indium bump bonds and superconducting solder bonds. The processor chip may be a superconducting processor chip including a plurality of qubits, couplers, Digital to Analog Converters, QFP shift registers and analog lines; and the I/O chip includes Digital to Analog Converters, frequency-multiplexed resonant (FMR) read-in, frequency-multiplexed resonant (FMR) readout, microwave and analog lines. The I/O chip may further comprise: a shield layer below the first and the second plurality of contacts, the shield layer comprising a material with high critical temperature relative to a material comprising the processor chip, the shield layer pierced by superconducting vias leading to the first and the second plurality of contacts; and a substrate layer having a first surface that covers a second surface of the I/O chip, the second surface of the I/O chip opposed to the first surface of the I/O chip across a thickness of the I/O chip. The shield layer may comprise a type-II superconductor. The shield layer may include at least one of: holes and slots that extend therethrough. The I/O chip may further comprise a thermally conductive layer that covers a second surface of the substrate layer, the second surface of the substrate layer opposed to the first surface of the substrate layer across a thickness of the substrate layer. The thermally conductive layer may be comprised of a material that remains thermally conductive near 0 K. The material that remains thermally conductive near 0K may be selected from a group consisting of: copper and gold. The first and the second plurality of contacts of the I/O chip may be located in the shield layer. The processor chip may further comprises a shield layer below the plurality of contacts of the processor chip, the shield layer comprising a first material with high critical temperature relative to a material comprising the processor chip, and a number of superconducting vias that through the shield layer to provide a communicatively coupling to the plurality of contacts of the processor chip. The I/O chip may further comprise an I/O shield layer that underlies the first and the second plurality of contacts, the I/O shield layer comprising a second material with high critical temperature relative to a material comprising the processor chip, and a number of superconducting vias through the I/O shield layer that provide a communicative coupling to the first and the second plurality of contacts of the processor chip, the first material different from the second material. The first material may be a type-II superconductor. The shield layer may further comprise at least one of a number of holes or slots that extend therethrough. The processor chip may further comprise a substrate layer having a first surface that covers a second surface of the processor chip, the first surface of the substrate layer opposed to the first surface of the processor chip across a thickness of the processor chip. The processor chip may further comprise a thermally conductive layer that covers a second surface of the substrate layer, the second surface of the substrate layer opposed to the first surface of the substrate layer across a thickness of the substrate layer. The thermally conductive layer may be comprised of a material that remain thermally conductive near 0K. The material that remains thermally conductive near 0K may be selected from a group consisting of: copper and gold. The printed circuit board may be an assembly of a plurality printed circuit boards, all of the printed circuit boards in the plurality of printed circuit boards having a respective through-hole, the through-hole each having a respective perimeter with dimensions larger than corresponding dimensions of the perimeter of the processor chip. The processor system may further comprise a plurality of tiles on the I/O chip, at least one of the tiles in the plurality of tiles comprising a frequency-multiplexed resonant (FMR) read-in, at least one of the tiles in the plurality of tiles comprising a frequency-multiplexed resonant (FMR) readout, at least one readout-enabled microwave line communicatively coupled to the at least one tile comprising a FMR readout and at least one read-in-enabled microwave line communicatively coupled to the at least one tile comprising a FMR read-in. The FMR readout and the FMR read-in may be communicatively coupled to at least one other element on the processor chip by at least one of a bump bond and a solder bond.

A method of fabricating a processor system is described. The processor system comprises: a processor chip; a printed circuit board, the printed circuit board having a through-hole with a perimeter that has dimensions that are larger than corresponding dimensions of a perimeter of the processor chip; and an input/output (I/O) chip, the I/O chip having a perimeter that has dimensions that are larger than corresponding dimensions of the through-hole of the printed circuit board. The method comprises: forming a plurality of contacts on, at, or recessed in a first surface of the processor chip that extend along a perimeter of the processor chip; forming a plurality of contacts distributed on, at, or recessed in a first surface of the printed circuit board that extend along the perimeter of the through-hole; forming a first plurality of contacts distributed on, at, or recessed in a first surface around a perimeter of the I/O chip, and a second plurality of contacts distributed on, at, or recessed in the first surface along the inside of the perimeter of the I/O chip; aligning the processor chip at least partially received inside the through-hole of the printed circuit board; at least partially covering the first surface of the I/O chip with at least a portion of the first surface of the processor chip and with a least a portion of the first surface of the printed circuit board; and mating the first plurality of contacts on the I/O chip with the plurality of contacts on the printed circuit board and the second plurality of contacts on the I/O chip with the plurality of contacts on the processor chip. The plurality of contacts on, at, or recessed in a first surface of the processor chip, the plurality of contacts distributed at a first surface of the printed circuit board and the a first plurality and a second plurality of contacts distributed on, at, or recessed in a first surface of the I/O chip may be selected from a group comprising: Indium bump bonds and superconducting solder bonds. The processor chip may comprise a plurality of qubits, couplers, Digital to Analog Converters, Quantum Flux Parametron (QFP) shift registers and analog lines; and forming a first plurality and a second plurality of contacts distributed at a first surface of the I/O chip includes forming a first plurality and a second plurality of contacts distributed on, at, or recessed in a first surface of a I/O chip comprising Digital to Analog Converters, frequency-multiplexed resonant (FMR) read-in, frequency-multiplexed resonant (FMR) readout, microwave and analog lines. The method may further comprise: forming an I/O shield layer below the first and the second plurality of contacts on the I/O chip, the shield layer comprising a material with high critical temperature relative to a material comprising the processor chip, the shield layer including a number of superconducting vias that provide a communicative path to the contacts; and forming an I/O substrate layer having a first surface covering a second surface of the I/O chip, the second surface of the I/O chip opposed to the first surface of the I/O chip across a thickness of the I/O chip. The material with high critical temperature may include a type-II superconductor with a high critical temperature relative to a material comprising the processor chip. The method may further comprise forming at least one of: holes and slots, that extend therethrough the I/O shield layer. The method may further comprise: forming an I/O thermally conductive layer covering a second surface of the I/O substrate layer, the second surface of the I/O substrate layer opposed to the first surface of the I/O substrate layer across a thickness of the I/O substrate layer. The thermally conductive layer may comprise a material that remain thermally conductive near 0K. The thermally conductive layer may comprise: copper or gold. The first and a second plurality of contacts of the I/O chip may be distributed at the I/O shield layer. The method may further comprise: forming a processor shield layer below the plurality of contacts on the processor chip, the shield layer comprising a first material with relatively high critical temperature relative to a material comprising the processor chip, the shield layer pierced by superconducting vias leading to the contacts. The method may further comprise forming an I/O shield layer below the first and the second plurality of contacts on the I/O chip, the I/O shield layer comprising a second material with high critical temperature relative to a material comprising the processor chip, and forming one or more superconducting vias that extend through the I/O shield layer to the first and second plurality of contacts, the first material different from the second material. The shield layer may comprise a type-II superconductor. The method may further comprise: forming at least one of: holes and slots that extend through the processor shield layer. The method may further comprise forming a processor substrate layer having a first surface covering a second surface of the processor chip, the second surface opposed to the first surface of the processor chip across a thickness of the processor chip. The method may further comprise forming a processor chip thermally conductive layer covering a second surface of the substrate layer, the second surface of the substrate layer opposed to the first surface of the substrate layer across a thickness of the substrate layer. The thermally conductive layer may comprise a material that remains thermally conductive near 0K. The thermally conductive layer may comprise copper or gold. The printed circuit board may be an assembly of a plurality printed circuit boards, all of the printed circuit boards in the plurality of printed circuit boards having a respective through-hole with dimensions larger than corresponding dimensions of the processor chip, the through-holes approximately centrally located in the printed circuit boards. The plurality of contacts of the processor chip may be a plurality of bumps; the a plurality of contacts of the printed circuit board may be a plurality of bumps; and the first plurality and second plurality of contacts of the I/O chip may be a first plurality and a second plurality of pads. The method may further comprise: forming a plurality of tiles on the I/O chip, at least one of the tiles in the plurality of tiles comprising a frequency-multiplexed resonant (FMR) readout, at least one of the tiles in the plurality of tiles comprising a FMR read-in; communicatively coupling at least one readout-enabled microwave line to the at least one tile comprising a FMR readout; and communicatively coupling at least one read-in-enabled microwave line to the at least one tile comprising a FMR read-in. The method may further comprise: communicatively coupling the FMR readout to at least one other element on the processor chip by at least one of a bump bond and a solder bond and communicatively coupling the FMR read-in to at least one other element on the processor chip by at least one of a bump bond and a solder bond.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
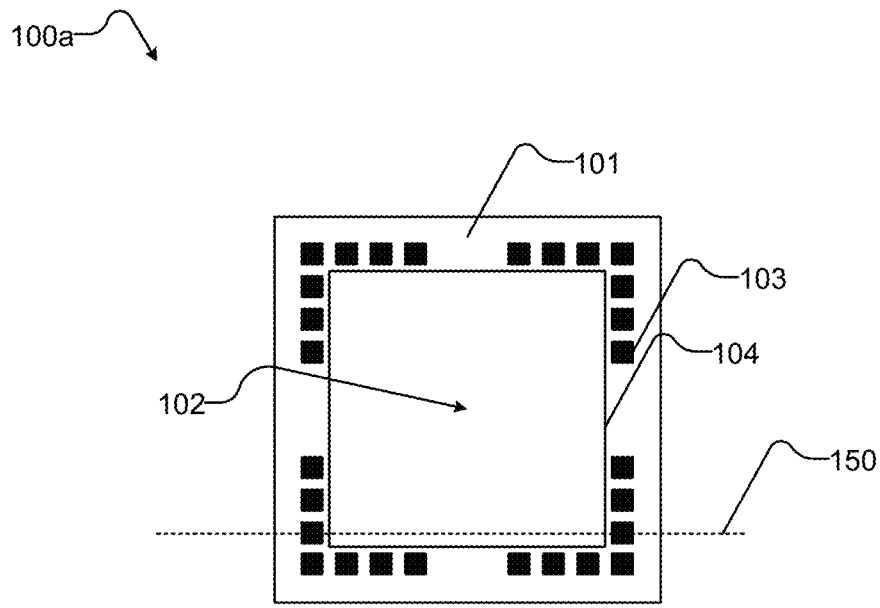
FIG. 1A is a plan view of an example layout of a printed circuit board comprising a plurality of contacts, according to the present disclosure.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Generally, processors, including analog or quantum processors, are rectangular microchips which are wirebonded to printed circuit boards (PCBs). Where the processor is a superconducting quantum processor, the PCB is also a superconducting PCB. As the size of a processor, for example a quantum processor, increases, the number of input/output lines also increases, leading to increased complexity of assembly of the processor. For example, as the number of input/output lines increases, the complexity of the processor sample-holder also increases, leading to increased physical space requirement. In some implementations, for example where the processor is housed in an isolated environment (e.g., a cryogenic environment), increased physical space needs may become unpractical. Similarly, a larger number of input/output lines requires a larger number of electrical filtering, leading to growing physical space requirements and growing power requirements. Also, with an increased number of input/output lines, wirebonding becomes more difficult, potentially requiring more time and specialized technicians. For superconducting processors that operates at cryogenic temperatures, the probability that a wirebonding fails during cool-down also increases with an increased number of input/output lines, potentially causing expensive delays in testing and deployment of the processor. Therefore, there is the need to at least partially limiting penalties in hardware assembly when the complexity of a processor increases.

The present disclosure describes systems and methods of assembly of superconducting processors comprising a superconducting printed circuit board (PCB), an input/output (I/O) chip and a superconducting processor chip, collectively bonded though a plurality of contacts. In the present disclosure and the appended claims, the words 'contact' and 'contacts' are used to indicated bonding materials and structures used to assemble a PCB, input/output chip and a processor chip. Contacts may, for example and without limitation, take the form of Indium bump bonds, superconducting solder bonds, or similar structures. A person skilled in the art will understand that chips featuring solder bonds may be mated through a reflow process, while Indium bonds (or bonds comprising another superconducting material that remain pliable through a wide range of temperatures) may be mated through a mechanical process (e.g., a press). In some implementations, a combination of bumps and pads may be used.

FIG. 1A is a plan view of an example layout 100a of a printed circuit board (PCB) 101 comprising a plurality of contacts, according to the present disclosure.

Figure 1B:
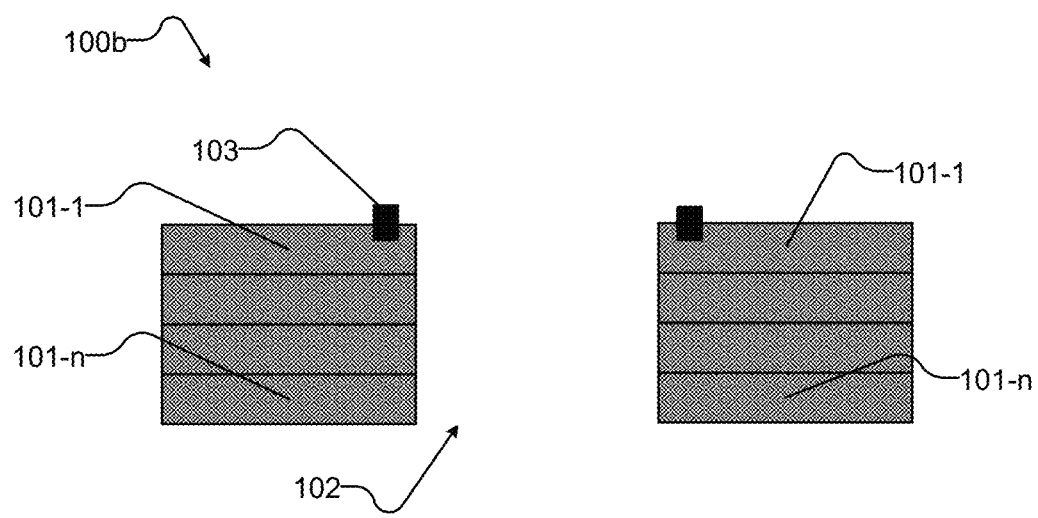
FIG. 1B is a cross-sectional view of an example layout of an assembly comprising a plurality of contacts and a plurality of printed circuit boards.
Figure 4:
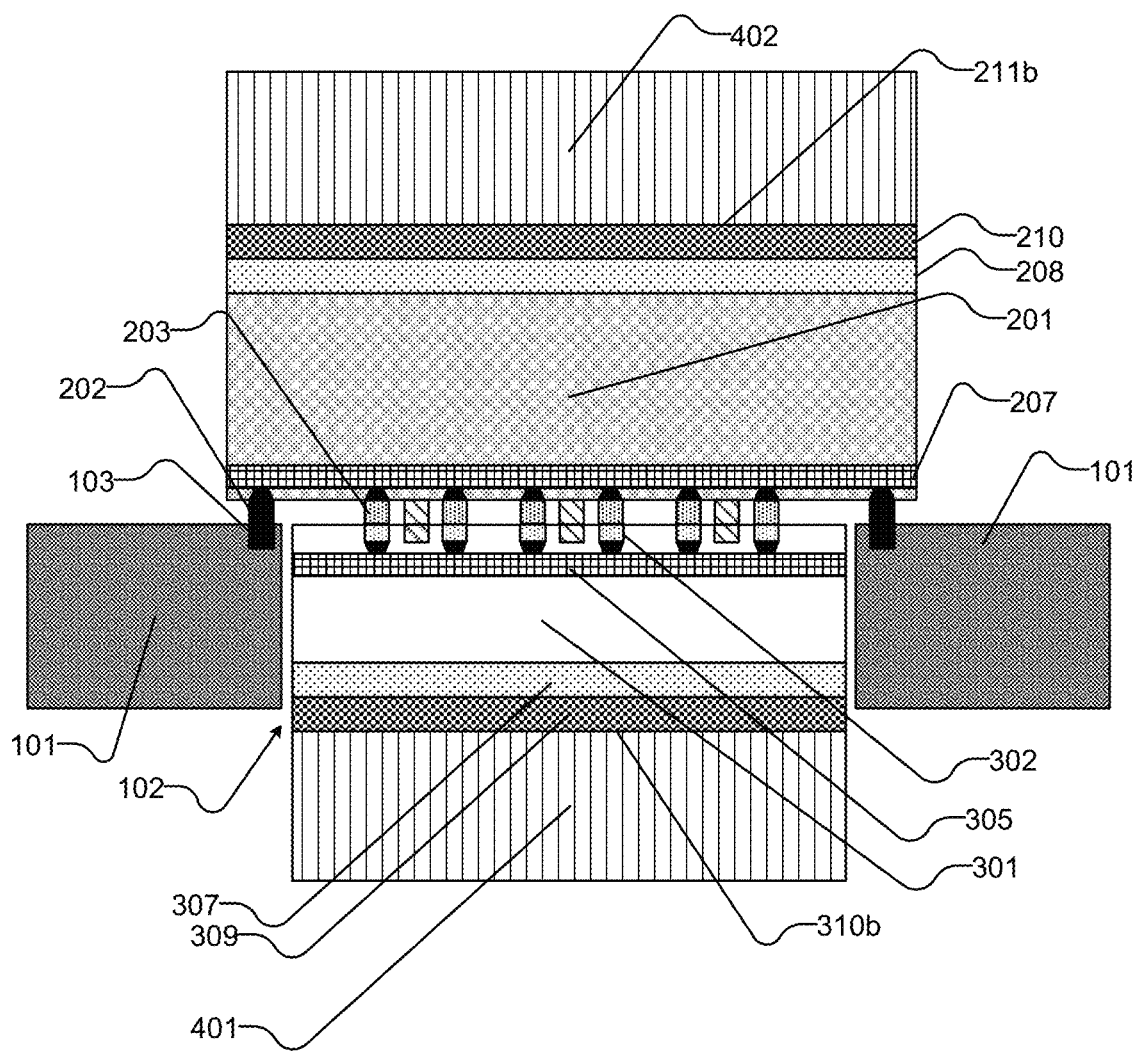
FIG. 4 is a cross-sectional view of an example processor system showing the relative position of a printed circuit board, a processor chip and an I/O chip with mated pads.

In some implementations, PCB 101 may be a superconducting PCB. In at least one implementation, PCB 101 is an assembly of multiple PCBs, as shown in FIG. 1B. PCB 101 comprises a through-hole 102, located approximately centered in PCB 101. Through-hole 102 has a size larger than a processor chip (not shown in FIG. 1A) and is able to accommodate a processor chip. PCB 101 comprises a plurality of contacts 103 (only one called out in FIG. 1A to reduce clutter) near a perimeter 104 of through-hole 102. Contacts 103 are distributed in a pattern similar to a pattern used on an outer ring of contacts on an I/O chip (not shown in FIG. 1A, see FIG. 2A). Contacts 103 may, for example and without limitation, take the form of Indium bump bonds, superconducting solder bonds, or similar structures. A person skilled in the art will understand that the number of contacts 103 shown in FIG. 1A is an example and on other implementations, a larger or smaller number of contacts 103 may be used. Similarly, the pattern of contacts 103 shown in FIG. 1A is an example, and in other implementations contacts 103 may be distributed in another pattern, similar to the pattern used on an outer ring of contacts on an I/O chip. Layout 100a of PCB 101 may be used in a processor assembly as shown in FIG. 4. Also shown in FIG. 1A is a cross-section line 150 for illustrative purpose to aid in the description of FIG. 1B and FIG. 4.

FIG. 1B is a cross-sectional view of an example assembly 100b comprising a plurality of contacts as described in FIG. 1A and a plurality of printed circuit boards (PCBs) 101-1 through 101-n (collectively, 101), taken along cross-section line 150 (not shown in FIG. 1B). PCB 101 has a through-hole 102, as described above with reference to FIG. 1A. In at least one implementation, each PCB 101-1 through 101-n is placed in the assembly of multiple PCBs so as to collectively define through-hole 102. Layout 100b of PCB 101 may be used in a processor assembly as shown in FIG. 4.

Figure 2A:
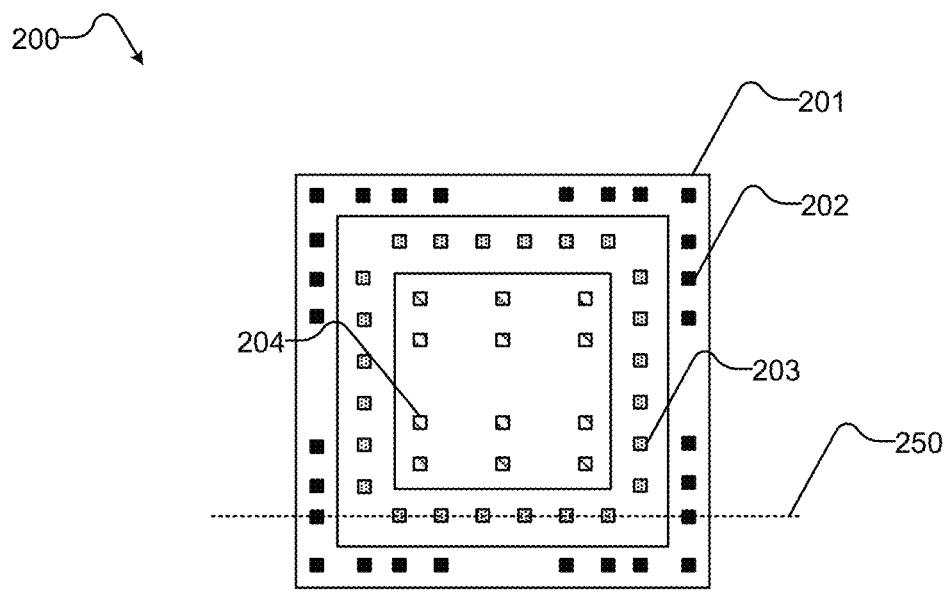
FIG. 2A is a planar view of an example layout of an input/output (I/O) integrated circuit structure or "chip" comprising a plurality of contacts, according to the present disclosure.

FIG. 2A is a planar view of an example layout 200 of an input/output (I/O) integrated circuit structure or chip 201 comprising a plurality of contacts, according to the present disclosure.

I/O chip 201 comprises I/O circuitry, including Digital to Analog Converters (DACs), frequency-multiplexed resonant (FMR) read-in, frequency-multiplexed resonant (FMR) readout, microwave and analog lines. I/O chip layout 200 comprises a first or outer ring of contacts 202 (only one contact 202 called out in FIG. 2A to reduce clutter) distributed in a pattern similar to the pattern of contacts 103 of PCB layout 100a of FIG. 1A or 100b of FIG. 1B. Contacts 202 may, for example and without limitation, take the form of Indium bump bonds, superconducting solder bonds, or similar structures. I/O chip 201 further comprises a second or inner ring of contacts 203 (only one contact 203 called out in FIG. 2A to reduce clutter) distributed in a pattern similar to the pattern used for contacts on a processor chip (not shown in FIG. 2A, see FIG. 3A). Contact 203 may, for example and without limitation, take the form of Indium bump bonds, superconducting solder bonds, or similar structures. A person skilled in the art will understand that the number of contacts 202 and 203 shown in FIG. 2A is an example and on other implementations, a larger or smaller number of contacts 202 and/or 203 may be used. Contacts 202 and contacts 203 are shown in FIG. 2A as having similar size to one another; however, this is an illustrative example and in other implementations, contacts 202 and contacts 203 may have different sizes from one another and may be comprised of different material from one another. Similarly, the pattern of contacts 202 and 203 shown in FIG. 2A is an illustrative example, and in other implementations contacts 202 and 203 may be distributed in another pattern, for instance where contacts 202 are distributed in a pattern similar to the pattern of contacts 103 of PCB layout 100a or 100b and where contacts 203 are distributed in a pattern similar to the pattern of contacts used on a processor chip.

I/O chip 201 is shown in FIG. 2A as having similar size as PCB 101 of FIGS. 1A and 1B; however, the relative size of PCB 101 and I/O chip 201 in FIGS. 1A and 1B and FIG. 2A is an illustrative example and PCB 101 may be larger than I/O chip 201, for example, as shown in FIG. 4.

In some implementations, I/O chip layout 200 of I/O chip 201 comprises a grid of tiles 204 (only one called out in FIG. 2A to reduce clutter). Each tile 204 comprises a frequency-multiplexed resonant (FMR) read-in and/or a FMR readout (FMRR), communicatively coupled to at least one other element on a processor chip by a bump bond or a solder bond or other coupling, as described in more details in FIG. 8. Read-in microwave lines and readout microwave lines are communicatively coupled to tiles 204.

Figure 2B:
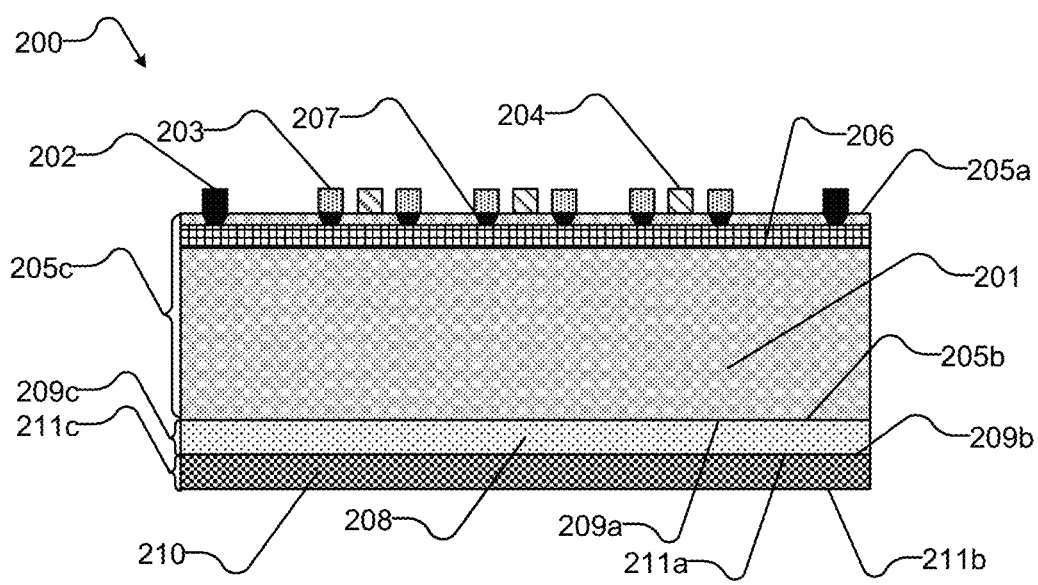
FIG. 2B is a cross-sectional view of an example layout of an I/O integrated circuit structure or "chip" comprising a plurality of contacts, according to the present disclosure

FIG. 2A shows a cross-section line 250 for illustrative purpose to aid in the description of FIG. 2B.

FIG. 2B is a cross-sectional view of the layout 200 of the I/O chip 201, as described in FIG. 2A, along cross-section line 250 of FIG. 2A (not shown in FIG. 2B), the I/O chip 201 comprising a plurality of contacts, according to the present disclosure. I/O chip 201 comprises a first or outer ring of contacts 202 (only one called out in FIG. 2B) distributed on an upper surface 205a of I/O chip 201, in a pattern similar to the pattern of contacts 103 of PCB layout 100a of FIG. 1A and 100b or FIG. 1B. Contacts 202 may, for example and without limitation, take the form of Indium bump bonds, superconducting solder bonds, or similar structures. I/O chip 201 further comprises a second or inner ring of contacts 203 (only one called out in FIG. 2B to reduce clutter) as described in FIG. 2A. In some implementations, I/O chip layout 200 of I/O chip 201 comprises a grid of tiles 204 (only one called out in FIG. 2B to reduce clutter) as described in FIG. 2A.

I/O chip 201 comprises a shield layer 206 below, underlying or spaced inwardly of contacts 202 and 203. Shield layer 206 may be a type-II superconducting shield layer with a relatively high critical temperature with respect to the critical temperature of the material comprising a processor integrated circuit or chip (shown in FIGS. 3A and 3B). Alternatively, shield layer 206 may be comprised of another type of superconducting material with a relatively high critical temperature with respect to the critical temperature of the material comprising a processor integrated circuit or chip. Trapped flux can be largely mitigated through high critical temperature ($T_c$) shields, for example comprising type-II superconductors, whose superconducting transition happens significantly before the superconducting transition of the sensitive circuitry of I/O chip 201. The excess flux is trapped by the high-$T_c$ shield while the sensitive circuitry is still in a normal (i.e., non-superconducting) state. When the sensitive circuitry is superconducting, it is substantially isolated from the excess magnetically flux, thus excess flux will not be trapped herein. In some implementations, contacts 202 and 203 are part of shield layer 206.

Superconducting vias 207 (only one called out in FIG. 2B to reduce clutter) extend through shield layer 206, leading excess magnetic flux to contacts 202 and 203. Additionally, one or more holes may extend through shield layer 206, where excess magnetic flux is deliberately trapped, thus removed from sensitive areas of I/O chip 201 and a processor chip, and/or by slots to guide excess magnetic flux away from sensitive areas of I/O chip 201 and a processor integrated circuit or chip.

I/O chip 201 also comprises a substrate layer 208, having an upper surface 209a adjacent to a bottom surface 205b of I/O chip 201, bottom surface 205b opposite upper surface 205a across a thickness 205c of I/O chip 201. Substrate layer 208 serves as a substrate upon which I/O circuitry is fabricated.

In some implementations, I/O chip 201 also comprises a thermally conductive layer 210, having an upper surface 211a and a bottom surface 211b, opposite upper surface 211a across a thickness 211c of thermally conductive layer 210. Upper surface 211a is adjacent to a bottom surface 209b of substrate layer 208, bottom surface 209b opposite upper surface 209a, across a thickness 209c of substrate layer 208. Thermally conductive layer 210 can comprise copper, gold or another material which remains thermally conductive near 0 Kelvin.

I/O chip layout 200 of I/O chip 201 may be used in a processor assembly, for example as shown in FIG. 4 and described below with respect thereto.

Figure 3A:
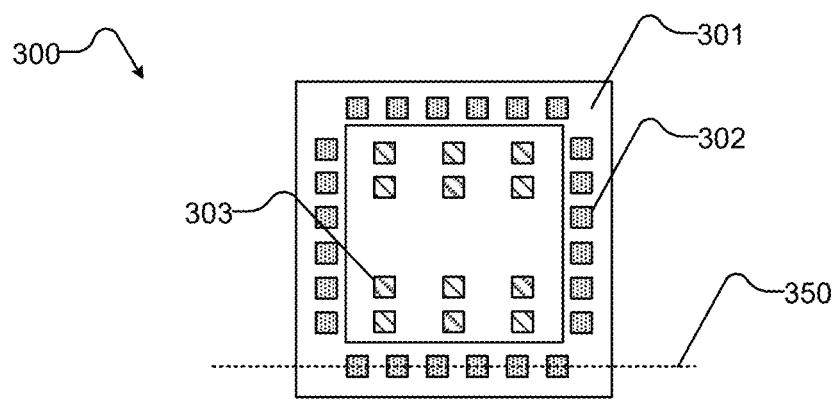
FIG. 3A is a planar view of an example layout of an processor integrated circuit structure or "chip" comprising a plurality of contacts, according to the present disclosure.

FIG. 3A is a planar view of an example layout 300 of a processor chip 301 comprising a plurality of contacts, according to the present disclosure.

In some implementations, processor chip 301 may be a superconducting processor chip, for example a superconducting quantum processor chip. Processor chip 301 has a size smaller than through-hole 102 of PCB 101 of FIGS. 1A and 1B and is able to fit inside through-hole 102 with an outermost surface either flush with an outermost surface of PCB 101, below the outermost surface of PCB 101, or proud of outermost surface of PCB 101. Processor chip 301 includes processor circuitry. When processor chip 301 is a quantum processor, it includes circuitry or circuit components such as, for example, qubits, couplers, Digital-to-Analog Converters (DACs), Quantum Flux Parametron (QFP) shift registers and analog lines. Processor chip 301 comprises a plurality of contacts 302 (only one called out in FIG. 3A to reduce clutter) distributed in a pattern similar to the pattern of contacts 203 of I/O chip layout 200 of I/O chip 201 of FIG. 2A. Contact 302 may, for example and without limitation, take the form of Indium bump bonds, superconducting solder bonds, or similar structures. A person skilled in the art will understand that the number of contacts 302 shown in FIG. 3A is an illustrative example and on other implementations, a larger or smaller number of contacts 302 may be used. Similarly, the pattern of contacts 302 shown in FIG. 3A is an illustrative example, and in other implementations contacts 302 may be distributed in another pattern, where contacts 302 are distributed in a pattern similar to the pattern of contacts used on a I/O integrated circuit or chip.

Processor chip 301 may be comprises of material substantially different from a material comprising I/O chip 201. I/O chip 201 may be comprised of a superconducting material, for example Niobium, while processor chip 301 may be comprised of a different superconducting material, for example Aluminum, for example in cases where lower-noise materials are favored for a superconducting processor chip and higher-reliability fabrication processes, rather than lower noise materials, are favored for I/O chips.

In some implementations, processor chip layout 300 of processor chip 301 comprises a grid of tiles 303 (only one called out in FIG. 3A to reduce clutter). Each tile 303 may comprise, for example, circuitry or circuit components such as qubits, couplers, qubit read-in and/or readout devices and DACs, and be communicatively coupled to one tile of an I/O chip, for example, one tile 204 of I/O chip layout 200 of FIG. 2A, by, for example, a bump bond or a solder bond, as described in more details in FIG. 8.

Figure 3B:
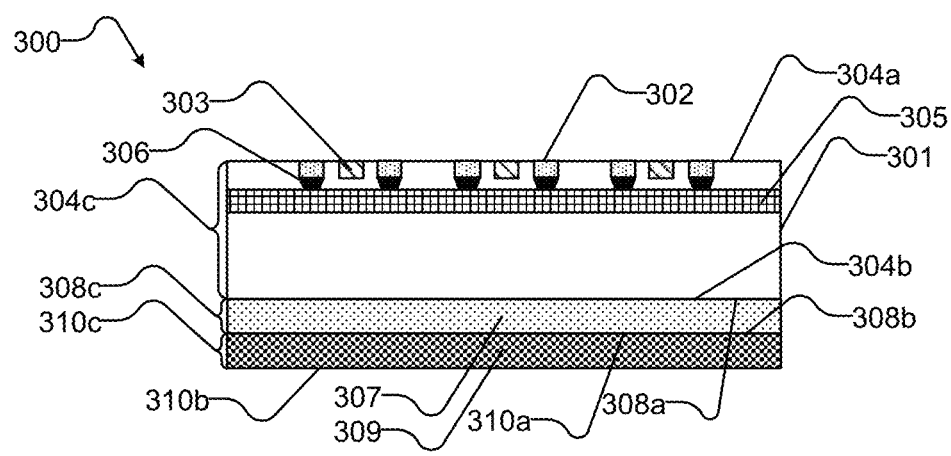
FIG. 3B is a cross-sectional view of an example layout of a processor integrated circuit structure or "chip" comprising a plurality of contacts, according to the present disclosure.

FIG. 3A shows a cross-section line 350 for illustrative purpose to aid in the description of FIG. 3B.

FIG. 3B is a cross-sectional view of example processor chip layout 300 of the processor chip 301 of FIG. 3A, along cross-section line 350 (not shown in FIG. 3B), processor chip 301 comprising a plurality of contacts, according to the present disclosure. Processor chip 301 comprises a plurality of contacts 302 (only one called out in FIG. 3B to reduce clutter) distributed flush with upper surface 304a of processor chip 301 in a pattern similar to the pattern of contacts 203 of I/O chip layout 200 of FIG. 2A. Contact 302 may, for example and without limitation, take the form of Indium bump bonds, superconducting solder bonds, or similar structures. In some implementations, processor chip layout 300 of processor chip 301 comprises a grid of tiles 303 (only one called out in FIG. 3B to reduce clutter), as described in FIG. 3A.

Processor chip 301 comprises a shield layer 305 below, underlying or spaced inwardly of contacts 302. Shield layer 305 may be a type-II superconducting shield layer with a relatively high critical temperature with respect to the critical temperature of the material comprising processor chip 301. Alternatively, shield layer 305 may be comprised of another type of superconducting material with a relatively high critical temperature with respect to the critical temperature of the material comprising processor chip 301. In some implementations, shield layer 305 is comprised of a different material than shield layer 206 of I/O chip 201 of FIG. 2B.

Superconducting vias 306 (only one called out in FIG. 3B to reduce clutter) extend through shield layer 305, leading excess magnetic flux to contacts 302. Additionally, holes may extend through shield layer 305, where excess magnetic flux is deliberately trapped, thus removed from sensitive areas of processor chip 301, and by slots to guide excess magnetic flux away from sensitive areas of processor chip 301.

Processor chip 301 also comprises a substrate layer 307, having an upper surface 308a adjacent to a bottom surface 304b of processor chip 301, bottom surface 304b opposite upper surface 304a across a thickness 304c of processor chip 301. Substrate layer 307 serves as a substrate upon which circuitry of processor 304 is fabricated, for example an electrically insulative substrate.

In some implementations, processor chip 301 also comprises a thermally conductive layer 309, having an upper surface 310a and a bottom surface 310b, opposite upper surface 310a across a thickness 310c of thermally conductive layer 309. Upper surface 310a is adjacent to a bottom surface 308b of substrate layer 307, bottom surface 308b opposite upper surface 308a, across a thickness 308c of substrate layer 307. Thermally conductive layer 309 can comprise copper, gold or another material which remains thermally conductive near 0 Kelvin.

Processor chip 301 may be used in a processor assembly as shown in FIG. 4.

FIG. 4 is a cross-sectional view of an example processor system 400 showing a relative position of printed circuit board 101 of FIG. 1A or 1B, processor chip 301 of FIGS. 3A and 3B and I/O chip 201 of FIGS. 2A and 2B with mated contacts, along cross-section lines 150, 250 and 350 of FIGS. 1, 2A and 3A, respectively.

Processor system 400 comprises a printed circuit board (PCB), for example PCB 101 of FIG. 1A or 1B, a processor chip, for example, processor chip 301 of FIGS. 3A and 3B, and an I/O chip, for example I/O chip 201 of FIGS. 2A and 2B. Processor chip 301 is located at least partially within through-hole 102 of PCB 101. I/O chip 201 is located above PCB 101 and processor chip 301, with respect to the plane of the page of FIG. 4, so contacts 202 of I/O chip 201 mate with contacts 103 of PCB layout 100a or 100b and contacts 203 of I/O chip 201 mate with contacts 302 of processor chip 301.

Processor chip 301 also comprises a shield layer 305, a substrate layer 307 and a thermally conductive layer 309, as described above in FIG. 3B.

In some implementations, a thermalization layer 401 may be positioned adjacent to a bottom surface 310b of thermally conductive layer 309 of processor chip 301 to thermalize processor chip 301.

I/O chip 201 also comprises a shield layer 206, a substrate layer 208 and a thermally conductive layer 210, as described above in FIG. 2B. In some implementations, a path 402 to thermalization layer 401 may be positioned adjacent to bottom surface 211b of thermally conductive layer 210 of I/O chip 201.

Figure 5:
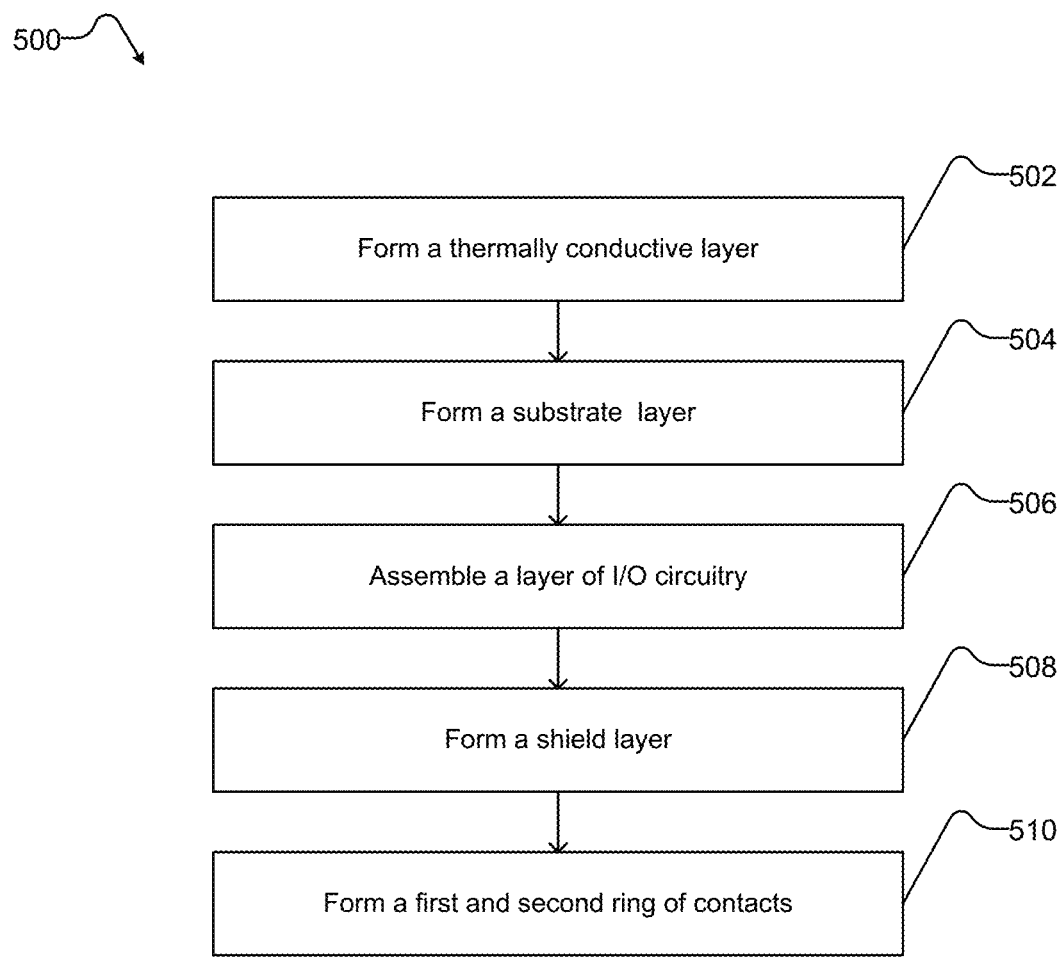
FIG. 5 is a flow chart of an example method of assembling an I/O chip comprising a plurality of contacts, according to the present disclosure.

FIG. 5 is a flow chart of an example method 500 of assembling an I/O chip comprising a plurality of contacts, according to the present disclosure. Method 500 may be used as part of an assembly of I/O chip having I/O chip layout 200, and will be described with reference to FIGS. 2A, 2B, and 5.

Method 500 comprises acts 502 to 510; however, a person skilled in the art will understand that the number of acts is an example, and, in some implementations, certain acts may be omitted, further acts may be added, and/or the order of the acts may be changed.

Method 500 starts at 502, by forming thermally conducting layer 210. Thermally conductive layer 210 can comprise copper, gold or another material which remains thermally conductive near 0 Kelvin.

At 504, substrate layer 208 is formed on upper surface 211a of thermally conductive layer 210. Substrate layer 208 serves as a substrate upon which I/O circuitry is fabricated.

At 506, I/O chip 201 is assembled on upper surface 209a of substrate layer 208. I/O chip 201 comprises I/O circuitry, including DACs, frequency-multiplexed resonant (FMR)

read-in, frequency-multiplexed resonant (FMR) readout, microwave and analog lines. In some implementations, I/O chip 201 comprises a grid of tiles 204, each tile 204 comprising a frequency-multiplexed resonant (FMR) readout and/or FMR read-in.

At 508, shield layer 206 is formed (e.g., deposited). Shield layer 206 may be a type-II superconducting shield layer with a relatively high critical temperature, pierced by superconducting vias 207. Alternatively, shield layer 206 may be pierced by holes or slots.

At 510, first or outer ring of contacts 202 and second or inner ring of contacts 203 are formed (e.g., deposited, patterned (e.g., masked and etched)) on I/O chip 201. Contacts 202 are distributed in a pattern similar to the pattern of contacts 103 of PCB layout 100a or 100b of PCB 101, while contacts 203 distributed in a pattern similar to the pattern used for contacts 302 of processor chip layout 300 of processor chip 301. Contacts 202 and 203 can, for example and without limitation, take the form of Indium bump bonds, superconducting solder bonds, or similar structures.

Figure 6:
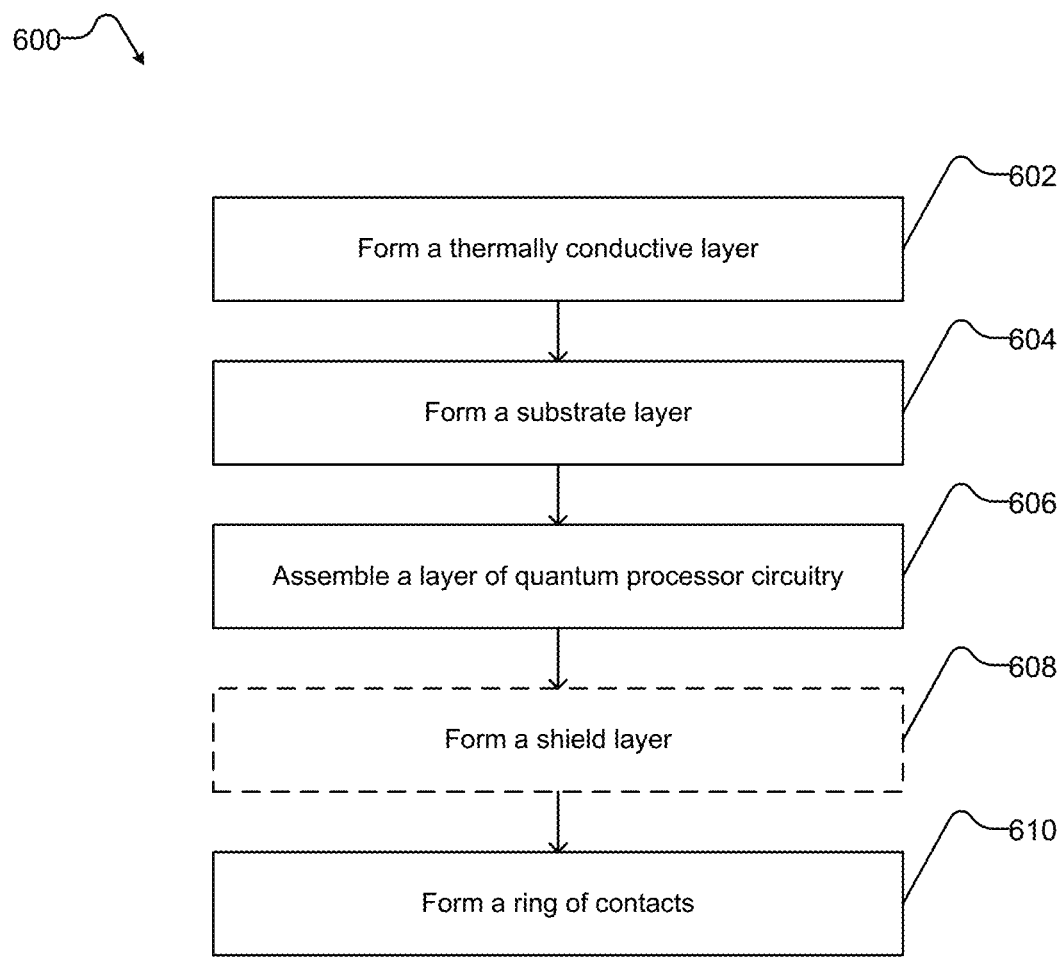
FIG. 6 is a flow chart of an example method of assembling a processor chip comprising a plurality of contacts, according to the present disclosure.

FIG. 6 is a flow chart of an example method 600 of assembling a processor chip comprising a plurality of contacts, according to the present disclosure. Method 600 may be used as part of an assembly of processor chip layout 300 and will be described with reference to FIGS. 3A and 3B.

Method 600 comprises acts 602 to 610; however, a person skilled in the art will understand that the number of acts is an example, and, in some implementations, certain acts may be omitted, further acts may be added, and/or the order of the acts may be changed.

Method 600 starts at 602, by forming (e.g., depositing) thermally conducting layer 309. Thermally conductive layer 309 can comprise copper, gold or another material which remains thermally conductive near 0 Kelvin.

At 604, substrate layer 307 is formed (e.g., depositing) on upper surface 310a of thermally conductive layer 309. Substrate layer 307 serves as a substrate upon which processor circuitry is fabricated.

At 606, processor chip 301 is assembled on upper surface 308a of substrate layer 307. Processor chip 301 comprises processor circuitry, for example, qubits, couplers, Digital-to-Analog Converters (DACs), Quantum Flux Parametron (QFP) shift registers and analog lines. In some implementations, processor chip layout 300 of processor chip 301 comprises a grid of tiles 303. Each tile 303 may comprise, for example, circuitry or circuit components such as qubits, couplers, qubit readout and/or read-in devices and DACs.

Optionally, at 608, shield layer 305 is formed (e.g., deposited). Shield layer 305 may be a type-II superconducting shield layer with a relatively high critical temperature, pierced by superconducting vias 306. Alternatively, shield layer 305 may include holes or slots.

At 610, contacts 302 are formed (e.g., deposited, patterned (e.g., masked and etched)) on processor chip 301. Contacts 302 are distributed in a pattern similar to the pattern of contacts 203 of I/O chip layout 200 of I/O chip 201 of FIG. 2A. Contact 302 may, for example and without limitation, take the form of Indium bump bonds, superconducting solder bonds, or similar structures.

Figure 7:
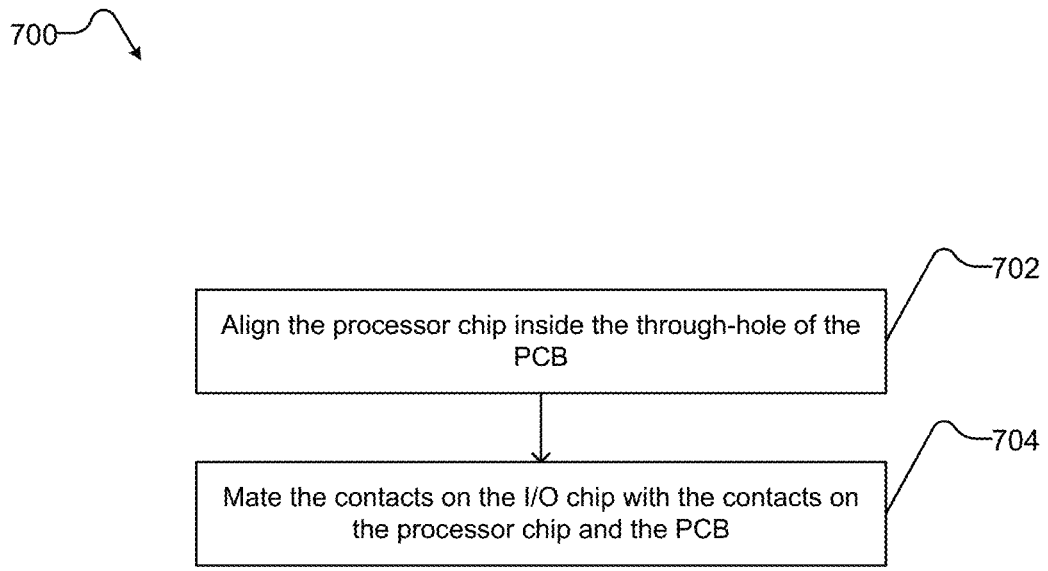
FIG. 7 is a flow chart of an example method assembling a processor system comprising a printed circuit board, a processor chip and an I/O chip, according to the present disclosure.

FIG. 7 is a flow chart of an example method 700 of assembling a processor system, for example processor system 400 of FIG. 4, comprising a printed circuit board, a processor chip and an I/O chip. Method 700 will be described with reference to processor system 400 of FIG. 4. Method 700 comprises acts 702 to 704; however, a person skilled in the art will understand that the number of acts is an example, and, in some implementations, certain acts may be omitted, further acts may be added, and/or the order of the acts may be changed.

Method 700 starts at 702. At 702, processor chip 301 is aligned inside through-hole 102 of PCB layout 100a or 100b.

At 704, I/O chip 201 is placed over PCB 101 and processor chip 301 so that contacts 202 of I/O chip 201 are mated with corresponding contacts 103 of PCB 101 and contacts 203 of I/O chip 200 are mated with corresponding contacts 302 of processor chip 301. Solder bonds contacts may be mated through a reflow process, while Indium bonds (or bonds comprising another superconducting material that remain pliable through a wide range of temperatures) may be mated through a mechanical process (e.g., a press).

Figure 8:
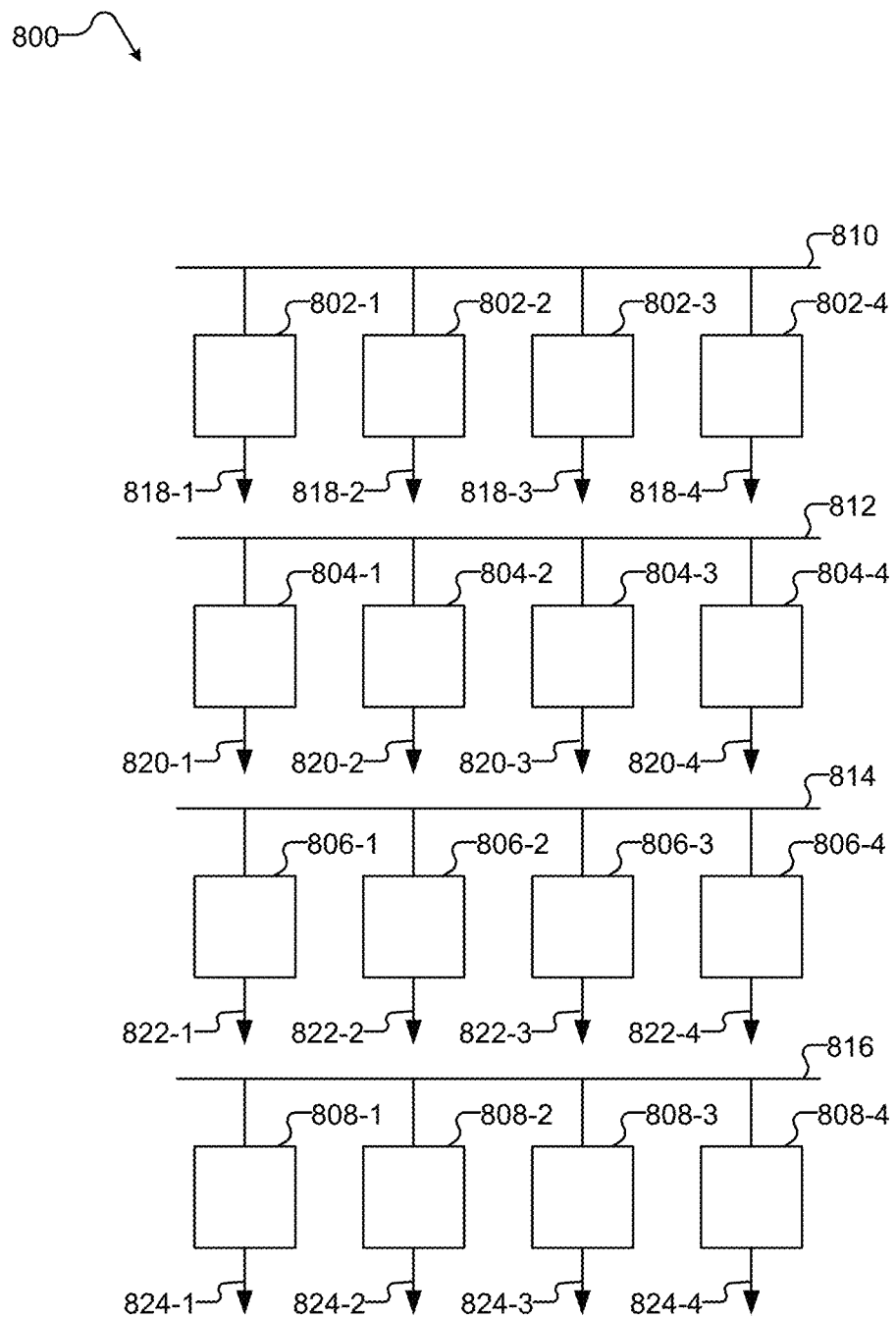
FIG. 8 is a schematic diagram illustrating an example arrangement frequency multiplex resonant (FMR) readout arrays in a superconducting processor.

FIG. 8 is a schematic diagram illustrating an example implementation of a portion 800 of a superconducting processor.

Portion 800 includes an array of frequency multiplex resonant (FMR) readouts 802-1, 802-2, 802-3, and 802-4 (collectively referred to in the present application as FMR readouts 802), 804-1, 804-2, 804-3, and 804-4 (collectively referred to in the present application as FMR readouts 804), 806-1, 806-2, 806-3, and 806-4 (collectively referred to in the present application as FMR readouts 806), and 808-1, 808-2, 808-3, and 808-4 (collectively referred to in the present application as FMR readouts 808). FMR readouts 802 are communicatively coupled to input line 810. FMR readouts 804 are communicatively coupled to input line 812. FMR readouts 806 are communicatively coupled to input line 814. FMR readouts 808 are communicatively coupled to input line 816.

In one implementation, input lines 810, 812, 814, and 816 are separate input lines. In another implementation, some or all of input lines 810, 812, 814, and 816 are communicatively coupled to one another, for example wired together.

FMR readouts 802 are communicatively coupled to other circuitry or circuit components of the superconducting processor (not shown in FIGS. 1A and 1B) at 818-1, 818-2, 818-3, and 818-4 respectively. FMR readouts 804 are communicatively coupled to other circuitry or circuit components of the superconducting processor at 820-1, 820-2, 820-3, and 820-4 respectively. FMR readouts 806 are communicatively coupled to other circuitry or circuit components of the superconducting processor at 822-1, 822-2, 822-3, and 822-4 respectively. FMR readouts 808 are communicatively coupled to other circuitry or circuit components of the superconducting processor at 824-1, 824-2, 824-3, and 824-4 respectively.

In one implementation, FMR readouts are communicatively coupled to other circuitry or circuit components of the superconducting processor in-situ. In another implementation, FMR readouts are communicatively coupled to other circuitry or circuit components of the superconducting processor by superconducting vias. In the present application, a via (vertical interconnect access) is an electrical connection between layers in a physical electronic circuit (e.g., an integrated circuit) that goes through the plane of one or more adjacent layers. In yet another implementation, FMR readouts are communicatively coupled to other circuitry or circuit components of the superconducting processor on a separate chip using bump bonds, solder bonds, or another suitable electrical communicative coupling.

FMR readouts 802 may be used as tiles 204 in I/O chip layout 200, as described in FIG. 2A. Further description and uses of FMR readouts 802 can be found in U.S. patent application No. 62/860,098.

Figure 9:
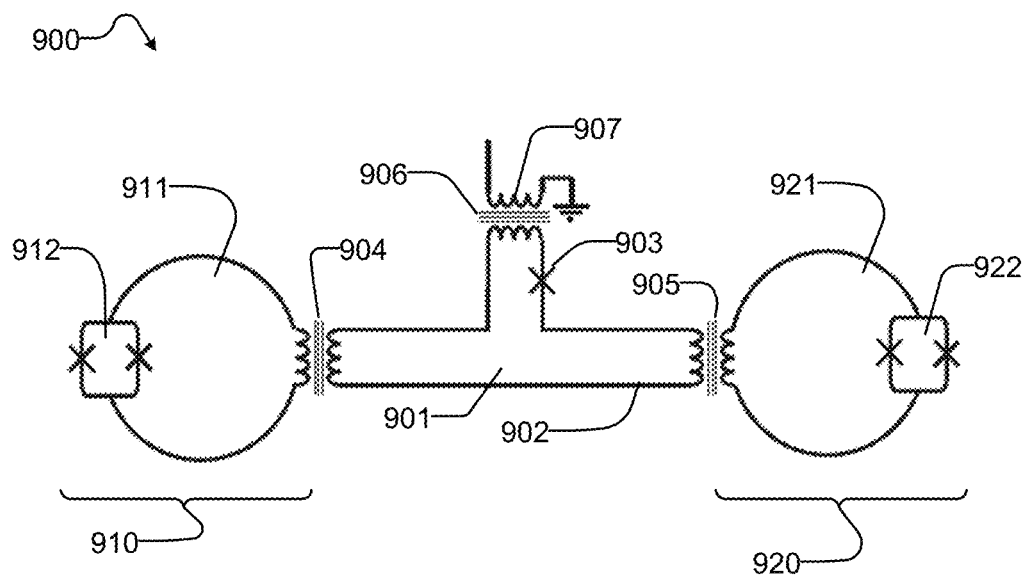
FIG. 9 shows a schematic diagram of an example embodiment as a system that includes two superconducting qubits and a controllable coupler.

FIG. 9 shows a schematic diagram of an exemplary implementation of a system 900 comprising a controllable coupler 901. Controllable coupler 901 includes a loop of superconducting material 902 interrupted by a Josephson junction 903 and is used to couple a first qubit 910 and a second qubit 920. First qubit 910 is comprised of a loop of superconducting material (or "qubit loop") 911 interrupted by a compound Josephson junction ("CJJ") 912 and is coupled to controllable coupler 901 through the exchange of flux 904 between controllable coupler 901 and first qubit 910. Second qubit 920 is comprised of a loop of superconducting material (or "qubit loop") 921 interrupted by a CJJ 922 and is coupled to controllable coupler 901 through the exchange of flux 905 between controllable coupler 901 and second qubit 920. Loop of superconducting material 902 is threaded by flux 906 created by electrical current flowing through a magnetic flux inductor 907. Controllable coupler 901 may be used to provide communicative coupling between qubits and thus be used in a quantum processor, in accordance with the presently described systems, devices, articles, and methods. Other examples of controllable couplers and qubits are presented in U.S. Pat. Nos. 7,898,282, and 7,800,395.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: US Provisional patent application No. 62/904,462, US Provisional patent application No. 62/860,098, U.S. Pat. Nos. 7,898,282, and 7,800,395.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A processor system comprising:
   a processor chip, the processor chip having a major face, a perimeter which bounds the major face of the processor chip and that has a set of dimensions, and a plurality of contacts, the contacts of the processor chip distributed along the perimeter of the processor chip;
   a printed circuit board, the printed circuit board having a through-hole and a plurality of contacts, the through-hole having a perimeter with a set of dimensions, the dimensions of the through-hole larger than corresponding dimensions of the processor chip to receive the processor chip at least partially by the through-hole, the contacts of the printed circuit board distributed about the perimeter of the through-hole; and
   an input/output (I/O) chip, the I/O chip having a major face, a perimeter which bounds the major face of the I/O chip and that has a set of dimensions that are larger than corresponding dimensions of the through-hole of the printed circuit board, a first plurality of contacts, and a second plurality of contacts, the first plurality of contacts of the I/O chip distributed along the perimeter of the I/O chip, the second plurality of contacts distributed along the perimeter of the I/O chip spaced inwardly from the first plurality of contacts with respect to the perimeter of the I/O chip, at least a portion of the major face of the I/O chip covering at least a portion of the major face of the processor chip and at least a portion of the major face of the I/O chip covering at least a portion of the major face of the printed circuit board, the first plurality of contacts of the I/O chip positioned to mate with the plurality of contacts of the printed circuit board, and the second plurality of contacts of the I/O chip positioned to mate with the plurality of contacts of the processor chip,
   wherein the I/O chip further comprises a shield layer below the first and the second plurality of contacts, the shield layer comprising a first material with high critical temperature relative to a material comprising the processor chip, the shield layer pierced by superconducting vias that provide a communicative coupling to the first and the second plurality of contacts.

2. The processor system of claim 1 wherein the plurality of contacts of the processor chip, the plurality of contacts of the printed circuit board and the first and the second plurality of contacts of the I/O chip are at least one of: Indium bump bonds and superconducting solder bonds.

3. The processor system of claim 1 wherein the processor chip is a superconducting processor chip including a plurality of qubits, couplers, Digital to Analog Converters, QFP shift registers and analog lines; and the I/O chip includes Digital to Analog Converters, frequency-multiplexed resonant (FMR) read-in, frequency-multiplexed resonant (FMR) readout, microwave and analog lines.

4. The processor system of claim 1 wherein the I/O chip further comprises:
   a substrate layer having a first surface that covers a second surface of the I/O chip, the second surface of the I/O chip opposed to the first surface of the I/O chip across a thickness of the I/O chip.

5. The processor system of claim 4 wherein the I/O chip further comprises a thermally conductive layer that covers a second surface of the substrate layer, the second surface of the substrate layer opposed to the first surface of the substrate layer across a thickness of the substrate layer.

6. The processor system of claim 1 wherein the first and the second plurality of contacts of the I/O chip are located in the shield layer.

7. The processor system of claim 1 wherein the processor chip further comprises a shield layer below the plurality of contacts of the processor chip, the shield layer comprising a second material with high critical temperature relative to other material comprising the processor chip, and a number of superconducting vias that through the shield layer to provide a communicatively coupling to the plurality of contacts of the processor chip, wherein the second material is different from the first material.

8. The processor system of claim 1 wherein the processor chip further comprises a substrate layer having a first surface that covers a second surface of the processor chip, the first surface of the substrate layer opposed to the first surface of the processor chip across a thickness of the processor chip.

9. The processor system of claim 8 wherein the processor chip further comprises a thermally conductive layer that covers a second surface of the substrate layer, the second surface of the substrate layer opposed to the first surface of the substrate layer across a thickness of the substrate layer.

\* \* \* \* \*